(12) United States Patent
Gopfert et al.

(10) Patent No.: US 10,156,591 B2
(45) Date of Patent: Dec. 18, 2018

(54) CURRENT METER (71) Applicant: Testo AG, Lenzkirch (DE)

(72) Inventors: Dirk Gopfert, Ihringen (DE); Jorg Kaiser, Emmendingen (DE); Dragan Stajic, Belgrade (RS); Vladimir Urosevic, Belgrade (RS)

(73) Assignee: Testo AG, Lenzkirch (DE)

( * ) Notice: Subject to any disclaimer, the term of this patent is extended or adjusted under 35 U.S.C. 154(b) by 0 days.

(21) Appl. No.: 15/172,395

(22) Filed: Jun. 3, 2016

(65) Prior Publication Data
US 2016/0356818 A1 Dec. 8, 2016

(30) Foreign Application Priority Data
Jun. 5, 2015 (DE) .................. 20 2015 004 037 U (51) Int. Cl.
G01R 1/22 (2006.01)
G01R 15/18 (2006.01)
G01R 19/00 (2006.01)
G01R 31/02 (2006.01)
G01R 1/067 (2006.01)

(52) U.S. Cl.
CPC ....... *G01R 15/186* (2013.01); *G01R 1/06788* (2013.01); *G01R 1/22* (2013.01)

(58) Field of Classification Search
CPC .......... G01R 1/22; G01R 15/186; G01R 1/04; G01R 15/125; G01R 1/0408; G01R 1/06788
USPC ......................................................... 324/127
See application file for complete search history.

(56) References Cited

U.S. PATENT DOCUMENTS

| 2,783,437 | A | * | 2/1957 | Yenni ....................... G01R 1/22 324/127 |
| 2,834,941 | A | * | 5/1958 | Hickok, Jr. ............... G01R 1/22 324/127 |
| 3,611,136 | A | * | 10/1971 | Ito ........................... H01F 38/30 324/127 |
| 5,634,246 | A | * | 6/1997 | Jermyn, Jr. ............. F16B 45/02 24/265 H |
| 6,043,640 | A | * | 3/2000 | Lauby ................... G01R 15/125 324/117 H |
| 6,091,237 | A | * | 7/2000 | Chen ..................... G01R 15/125 324/126 |

(Continued)

FOREIGN PATENT DOCUMENTS

| DE | 19962323 | 7/2001 |
| EP | 0233756 | 7/1992 |

(Continued)

*Primary Examiner* — Alesa Allgood
(74) *Attorney, Agent, or Firm* — Volpe and Koenig, P.C.

(57) ABSTRACT

A current meter having a movably mounted swivel element, in which an angle is subtended between a first leg and a second leg of the swivel element. A free end of the first leg is coupled to the handle and a free end of the second leg is coupled to the first receiving element, these being movable relative to each other, so that upon activating the handle an activating force engaging with the first leg can be generated. The activating force can be converted by the swivel element into a displacement force on the second leg, directed transversely to the activating force, so that by this displacement force the first receiving element can be moved.

19 Claims, 4 Drawing Sheets (56) References Cited

U.S. PATENT DOCUMENTS

| | | | | |
|---|---|---|---|---|
| 7,288,929 B2* | 10/2007 | Prsha | ............... | G01V 3/081 |
| | | | | 324/127 |
| 7,944,197 B2* | 5/2011 | Shah | ............... | G01R 1/22 |
| | | | | 324/115 |
| 8,120,350 B2* | 2/2012 | Shah | ............... | G01R 1/22 |
| | | | | 324/115 |
| 8,330,449 B2* | 12/2012 | Greenberg | ............ | G01R 15/12 |
| | | | | 324/115 |
| 9,366,698 B2* | 6/2016 | Legros | ............... | G01R 1/20 |
| 2011/0012589 A1* | 1/2011 | Greenberg | ............ | G01R 15/12 |
| | | | | 324/127 |
| 2011/0068773 A1* | 3/2011 | Harkness | ............ | G01R 15/186 |
| | | | | 324/127 |
| 2013/0208761 A1* | 8/2013 | Mavrides | ................ | G01J 5/089 |
| | | | | 374/121 |
| 2014/0203799 A1* | 7/2014 | Legros | ............... | G01R 1/20 |
| | | | | 324/126 |

FOREIGN PATENT DOCUMENTS

| | | |
|---|---|---|
| FR | 2170303 | 9/1973 |
| FR | 2538556 | 6/1984 |

* cited by examiner

CURRENT METER

INCORPORATION BY REFERENCE

The following documents are incorporated herein by reference as if fully set forth: German Patent Application No. DE 20 2015 004 037.3, filed Jun. 5, 2015.

BACKGROUND

The invention concerns a current meter, especially for the non-contact measuring of currents, with a magnetically conducting field receiver having a first receiving element and a second receiving element, wherein the first receiving element can move in a displacement direction relative to the second receiving element, wherein the field receiver can be moved from a closed measuring position to an open position in order to receive a cable by activating a handle.

Current meters of the kind mentioned above are known in many different designs. Generally they are configured as current measuring pliers or current pliers and have a movable and a stationary receiving element. In order to perform a measurement, the field receiver has to be opened outwardly in the radial direction by spreading apart the movable receiving element so as to introduce a cable into the field receiver. A problem can arise for the user of such a current meter when the user wants to perform a measurement in a constricted space, especially where several cables are arranged alongside each other, as in a circuit cabinet for example. Generally only one measurement should be performed on a single cable. Therefore, the disadvantage exists here that the user has to grasp and/or isolate one cable, especially one of several closely disposed cables, with one hand and then guide the current meter to the cable with the other hand. Thus, the user always needs both hands to perform a measurement. This necessarily means that the user has no hand free for safety purposes, especially to activate an emergency off switch, and therefore he is possibly exposed to the danger of electrocution. This can occur especially if there are insulation defects on the cables which the user touches with his hands. Since current meters of the abovementioned kind are used among other things for fault detection, a not insignificant risk therefore exists for the user of such current meters.

A further disadvantage of already known current meters of the kind mentioned above is that it can be very difficult and arduous to perform a measurement with them under constricted conditions. Thus, for example, it may occur that a single cable at a place where a measurement should be performed cannot be separated from other cables lying next to this one cable, in particular it cannot be pulled out from them. In such a case, it may happen that no measurement can be performed with current meters of the prior art, because due to little available room, especially because of the close arrangement of several cables next to each other, for example, the movable receiving element of the current meter cannot be spread apart at the measurement site, or the current meter cannot be brought into the open position against the cable being measured, in particular therefore because the current meters of the prior art often take up more space and/or are broader in the open position of the field receiver than in the measuring position.

SUMMARY

The objective which this invention is directed to address is to provide a current meter of the kind mentioned above which removes the aforementioned disadvantages.

This objective is achieved with a current meter having one or more features of invention In particular, according to the invention, it is provided for achieving this objective that the current meter has a movably mounted swivel element, wherein an angle is subtended between a first leg and a second leg of the swivel element, wherein the first leg, especially a free end of the first leg, is coupled to the handle and the second leg, especially a free end of the second leg, is coupled to the first receiving element, these being movable relative to each other, so that upon activating the handle an activating force engaging with the first leg can be generated, wherein this activating force can be converted by the swivel element into a displacement force on the second leg, directed transversely to the activating force, so that by this displacement force the first receiving element can be moved. Thanks to the design of the current meter according to the invention, it is possible for a user to perform a current measurement even under highly constricted conditions with only one hand using the current meter according to the invention. This is possible because the current meter according to the invention can be held with one hand and the handle for opening the field receiver can also be activated with this hand.

Moreover, it can be advantageous if the displacement direction is established as a displacement axis by a guide element, especially a guide element configured as a guide rail. In particular, it can be provided that the displacement direction runs along a lengthwise axis of the current meter according to the invention. Moreover, it can be provided that the current meter according to the invention is oriented so that the activating force is directed transversely to a lengthwise direction of the current meter. In particular, it can be provided that the handle can move transversely to a lengthwise direction of the current meter, in particular it can be recessed or pressed into a housing. Preferably, it can be provided that the displacement direction, running preferably along a lengthwise axis of the current meter, is established by a guide element, especially a guide rail, and/or that the current meter is oriented so that the activating force is directed transversely to a lengthwise axis of the current meter, in particular wherein the handle can move transversely to a lengthwise axis of the current meter, in particular it can be recessed or pressed into a housing.

Thanks to the aforementioned configurations of the current meter according to the invention, an even better measurement is possible under constricted conditions, especially because the first receiving element is not spread outwardly in the open position of the field receiver in the radial direction with respect to the lengthwise axis and/or a lengthwise side of the current meter according to the invention, but instead can be moved by an activation along the lengthwise axis of the current meter according to the invention.

It can furthermore be advantageous if the current meter according to the invention has a restoring element, especially a restoring element arranged inside a housing of the current meter. Preferably, the current meter can be oriented so that the first receiving element can move by activating the handle against a restoring force generated by the restoring element, especially one oriented contrary to the displacement direction, especially in linear motion. Preferably, the first receiving element can be movable along a lengthwise axis of the current meter. Furthermore, it can be provided in this case that the second receiving element is rigidly connected to a frame element and/or a housing or a housing piece of the current meter and/or is formed stationary as part of a housing or a frame element.

In particular, it can be provided that a restoring element or the aforementioned restoring element is designed as a pre-tensioned spring generating a restoring force. Preferably the spring is designed as a torsion spring and/or a leg spring, which is mounted so as to turn about an axis of rotation, preferably together with a swivel element or the above-described swivel element.

In order to assure a firm holding and/or a proper measurement procedure, it can moreover be provided that the restoring element in the measuring position presses the first receiving element, especially an end face of a free end of the first receiving element, with impact against the second receiving element, especially against an end face of a free end of the second receiving element. A cable on which a measurement is to be performed can thus be held and/or grasped by the field receiver. This prevents the cable from sliding out from the field receiver during a measurement, which might cause injury to the user and/or the measurement performed in this way might be faulty. In particular, it can be provided that the field receiver is closed into a ring in the measurement position. Furthermore, the configuration of the field receiver according to the invention can guarantee that the first receiving element is pressed with an adequate pressing force against the second receiving element, so that no air gap can be present between the first and the second receiving element in the measurement position, which air gap might result in an impairment of the magnetic flux and thus ultimately falsify the measurement result.

In order to more easily reach the cable on which a measurement is to be performed with the current meter according to the invention, especially to separate it or single it out from other cables, it can be provided that the second receiving element is fashioned as a hook and/or is C-shaped. In particular, it can be provided that the field receiver in the measurement position is closed into a ring and/or the second receiving element is fashioned as a hook and/or is C-shaped. Thanks to the configuration of the invention, an even better reaching of the cable, especially a better singling out of the cable, is possible, since because of the configuration of the second receiving element according to the invention it is possible to hook a particular cable and/or draw it out from a bundle of several cables, for example, so as to perform a measurement more easily on this cable.

It can be advisable for the current meter to have a housing, in particular a closed housing. In order to achieve an especially expedient arrangement, especially a compact and space saving one, it can be provided that the first receiving element can be pushed or pulled at least partly into a housing or the housing in order to move the field receiver into the open position.

Moreover, it can be advisable for the swivel element, especially the first leg of the swivel element, preferably a free end of the first leg, to be coupled to a connection piece and/or for the first leg to be coupled to the handle by a connection element or the connection element. In particular, it can be provided that the first leg of the swivel element is hinged to a connection piece and/or that the first leg, especially a free end of the first leg, is hinged to the handle by a connection element or the connection element.

In an especially expedient design of the current meter according to the invention it can be provided that the handle is mounted movable about a swivel axis, in particular so that it can be recessed or pressed at least partly into a housing, preferably transversely to the displacement direction of the first receiving element. It can be provided in this case that the current meter according to the invention is designed so that it can be operated with one hand and/or the handle is arranged on a lengthwise side of the current meter. The one-handed operation of a current meter of the kind mentioned above is preferred, since in this way the user can operate, for example, an emergency off switch with his free hand and/or the available room at the measurement location is so limited that working with both hands is a disadvantage.

Preferably the current meter according to the invention has one or more control elements and/or a regulator to operate the current meter. It can be provided that the at least one control element is designed as a push button and/or so that the operator can activate it with the same hand by which he also holds the current meter firmly. Moreover, it can be provided that the regulator is designed as a rotary regulator and/or arranged so that the user can activate it with the same hand by which he also holds the current meter firmly.

In order to achieve the greatest possible mobility, in an especially ergonomic design of the current meter according to the invention it can be provided that the current meter is designed as a handheld device, especially a wireless handheld device, and/or as current pliers or a current slider. For better grip safety of the current meter, one or more holding elements can be provided. These can be configured, for example, as rubberized grip surfaces and/or as grip surfaces arranged on one or both lengthwise sides.

It can be provided that the current meter according to the invention also has a voltage meter.

BRIEF DESCRIPTION OF THE DRAWINGS

The invention shall now be described more closely with reference to a particular example embodiment, but it is not confined to this example embodiment. Further example embodiments will result from combination of one or more features of the patent claims with each other and/or with one or more features of the example embodiments.

There are shown, partly in schematic representation

DETAILED DESCRIPTION OF THE PREFERRED EMBODIMENTS

Figure 1:
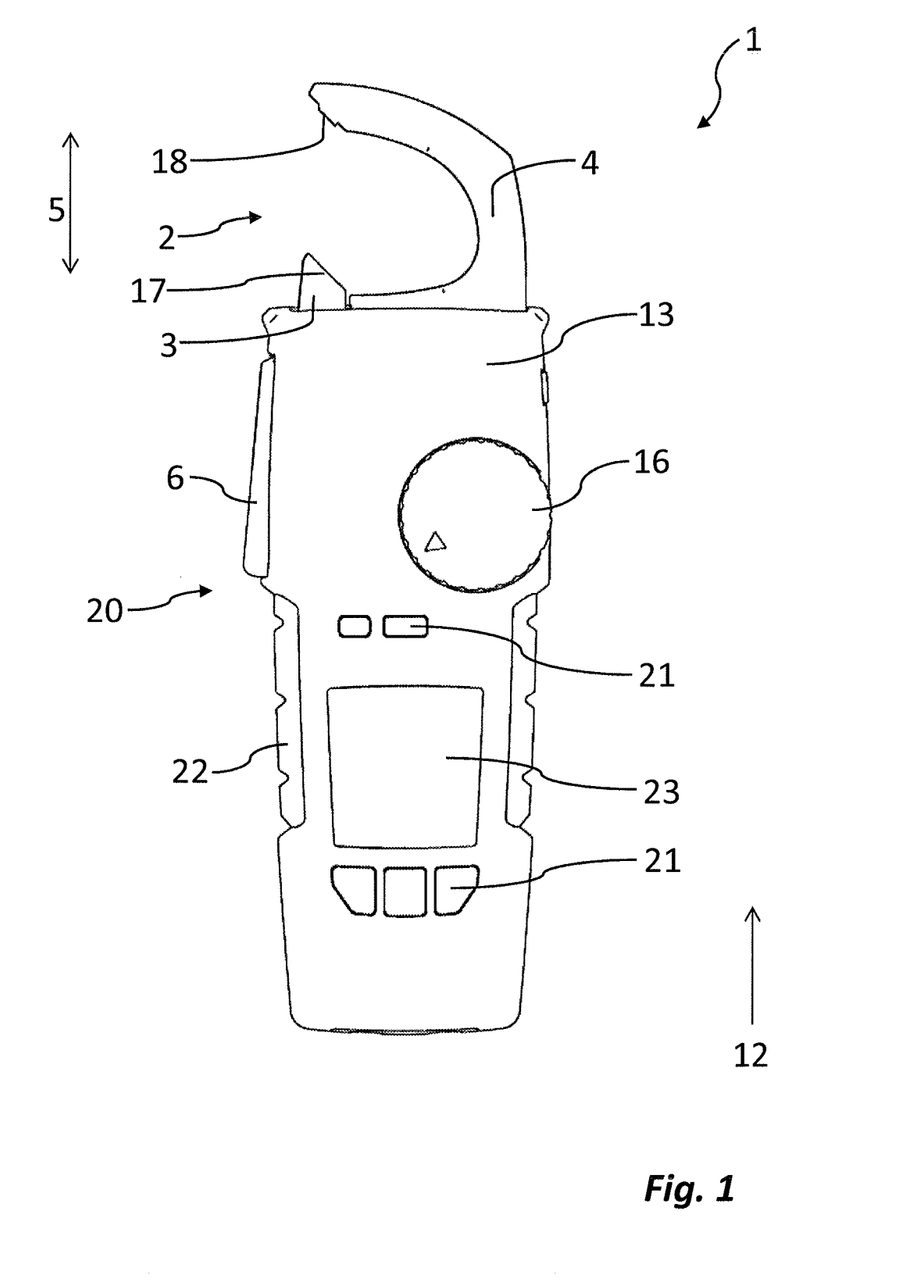
FIG. 1 an embodiment of the current meter according to the invention shown in top view, wherein the field receiver is in the open position, especially for leading a cable in or out, FIG. 2 the embodiment of the current meter according to the invention shown in top view, where the field receiver is in the measurement position, FIG. 3 a portion of the current meter according to the invention, being partly shown in a sectional view, where the field receiver is in the open position, FIG. 4 a portion of the current meter according to the invention, being partly shown in a sectional view, where the field receiver is in the measurement position, and FIG. 5 a detail view of the encircled region shown in FIG. 4 by a broken line of a second receiving element of the current meter according to the invention.
Figure 2:
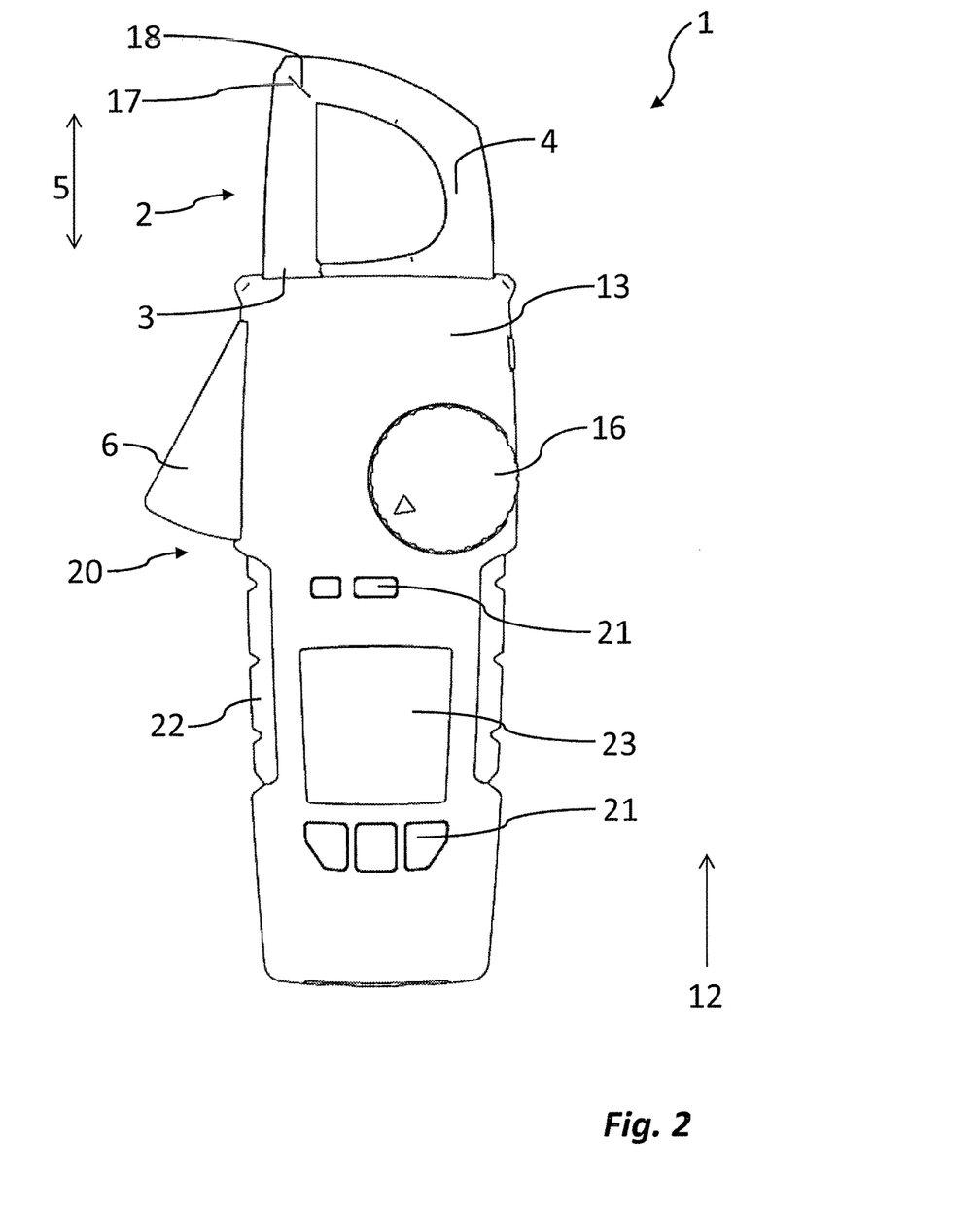

In FIGS. 1 and 2 a complete view of a current meter 1 according to the invention is shown. The current meter 1 is designed to measure currents, for example, in cables. It can be designed for noncontact measurement of currents, wherein no direct contact with a current conductor need be present. It has a magnetically conducting field receiver 2 to receive a cable with a first receiving element 3 and a second receiving element 4. The first receiving element 3 is designed so that it is movable along a displacement direction 5, especially along a displacement axis, relative to the second receiving element 4. For the receiving of a cable by the field receiver 2, the field receiver 2 can be displaced or is displaced by activating a handle 6 from a closed measurement position to an open position.

The handle 6 is fashioned on one lengthwise side 20 of the current meter 1 according to the invention so that it can be activated using one hand of the user, which also holds the current meter 1 firmly.

Figure 3:
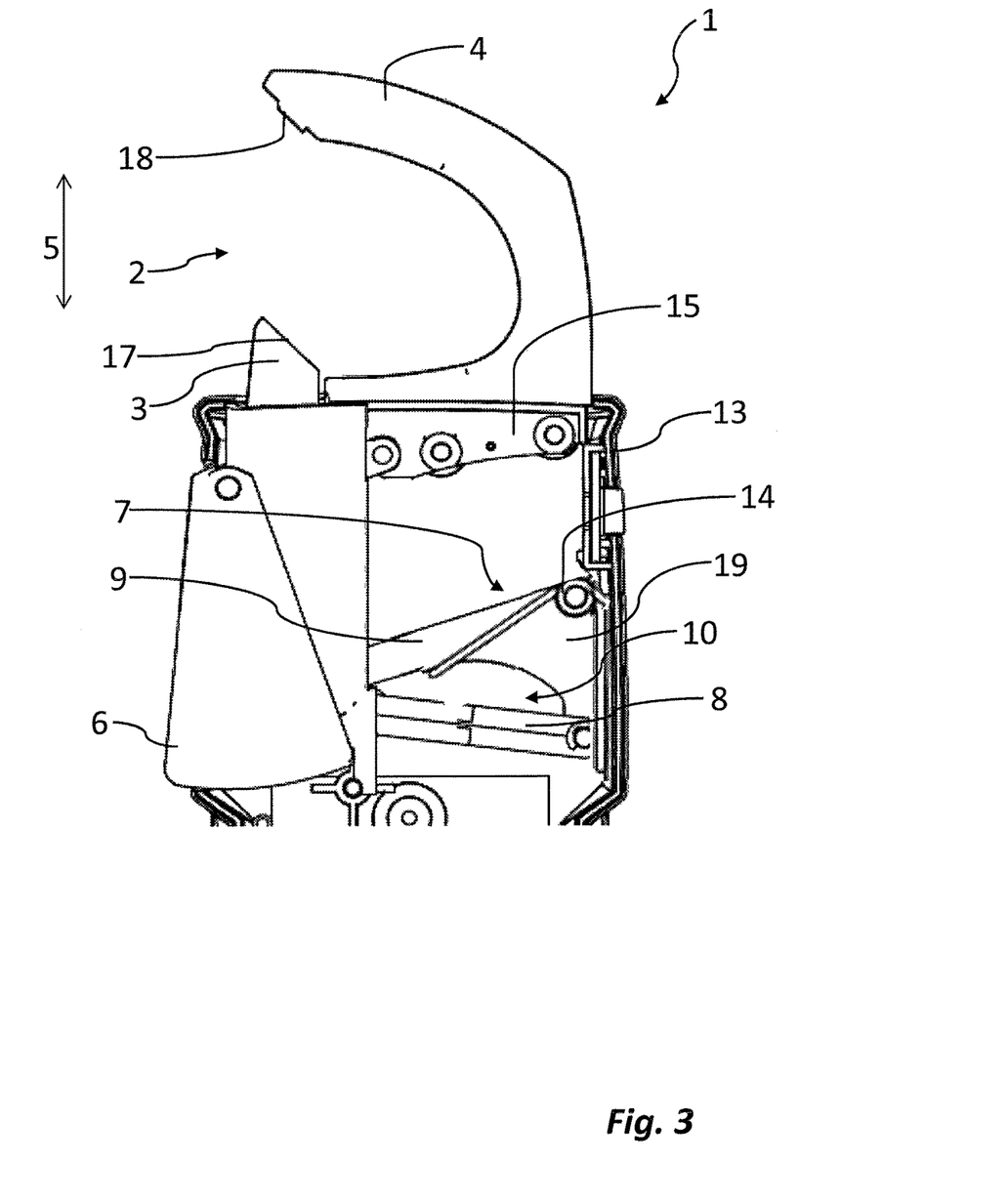
Figure 4:
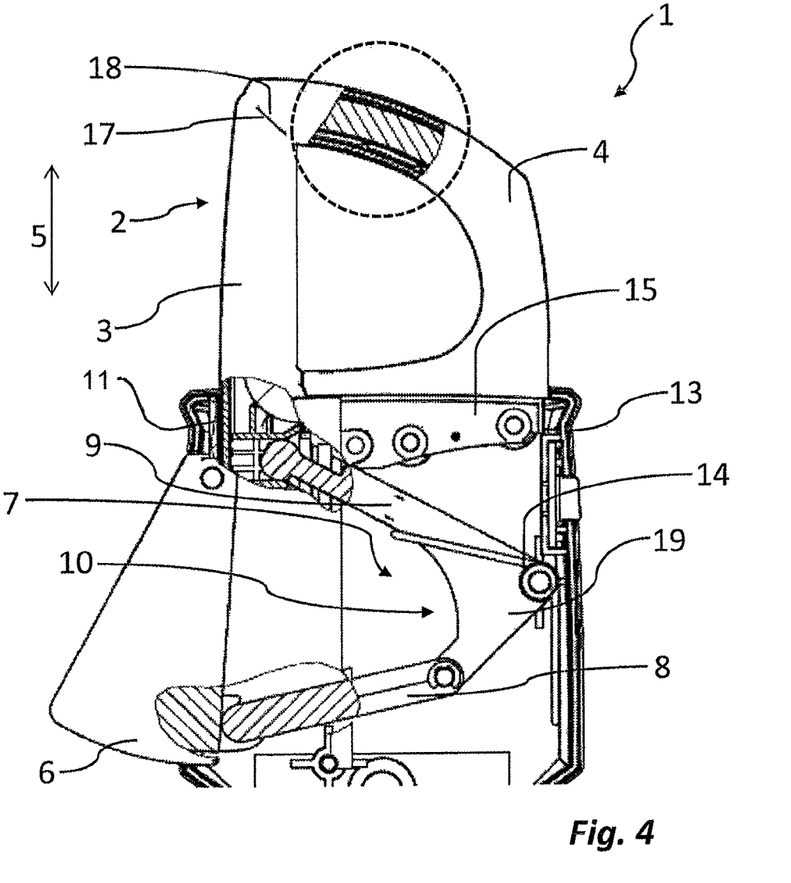

FIGS. 3 and 4 show partial regions of the current meter 1 according to the invention, partly as a sectional view through a housing 13.

The current meter 1 according to the invention 1 has a movably mounted swivel element 7, which is arranged inside the housing 13. This swivel element 7 has a first leg 8 and a second leg 9, between which an angle 10 is subtended. The first leg 8 is coupled to the handle 6 and the second leg 9 is coupled to the first receiving element 3, each being movable relative to each other. The swivel element 7 is designed here so that, when the handle 6 is activated, an activating force engaging with the first leg 8 can be generated, where this activating force can be converted by the swivel element 7 into a displacement force on the second leg 9, directed transversely to the activating force, so that by means of this displacement force the first receiving element 3 can be moved, in particular it can be moved along the lengthwise axis 12.

By activating the handle 6, the field receiver 2 can thus be displaced into an open position in that the first receiving element 3 can be moved by a guide element 11 in a displacement direction 5 running along a lengthwise axis 12 of the current meter. It can be provided that the guide element 11 is configured as a guide rail, by which the displacement direction 5 is established. The current meter 1 according to the invention is moreover designed so that the activating force is directed transversely to the lengthwise axis 12 of the current meter 1, wherein the handle 6 can move transversely to a lengthwise axis 12 of the current meter 1. It can be advantageous if the handle 6 can be recessed or pressed into a housing 13.

In order to displace the first receiving element 3 back to its starting position, in which the field receiver is in the measurement position, it can be provided that, after releasing the handle 6, a restoring element 14 arranged inside the housing 13 of the current meter 1 can pull the first receiving element 3 back once more. By activating the handle 6, therefore, the first receiving element 3 can be moved against a restoring force generated by the restoring element 14 and/or directed contrary to the displacement direction 5 along a lengthwise axis 12 of the current meter, especially in linear motion. The second receiving element 4 is rigidly connected to a frame element 15 or the housing 13 of the current meter 1. It can also be configured stationary as part of the housing 13 or part of a frame element 15.

The restoring element 14 represented in FIGS. 3 and 4 is designed as a torsion spring, especially as a leg spring, which is mounted so as to rotate about an axis of rotation together with the swivel element 7.

For the secure closing of the field receiver it is provided that the restoring element 14 in the measurement position presses an end face 17 of a free end of the first receiving element 3 with impact against an end face 18 of a free end of the second receiving element 4, so that no gap is present between the two receiving elements. As is shown in FIGS. 2 and 4, the field receiver in the measurement position is thus closed into a ring.

In order to more easily fish or grab individual cables by the second receiving element 4 in the open position of the field receiver 2, the second receiving element 4 is configured as a hook and/or in C-shape. As is shown in FIGS. 1 and 3, the first receiving element 3 in the open position of the field receiver 2 is at least partly shoved or drawn into the housing 13.

Figure 5:
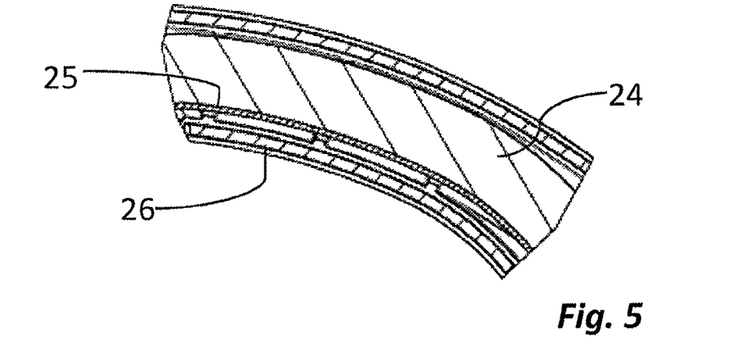

As is represented in FIGS. 4 and 5, the first leg 8 of the swivel element 7, especially by a free end, is hinged to a connection element 19. By the first leg 8, especially by a second free end of the first leg 8, the connection element 19 is coupled to the handle 6, in particular wherein the first leg 8 is hinged to the handle 6. The second leg 9, especially a free end of the second leg 9, of the swivel element 7 is likewise coupled to the connection element 19, especially being hinged to it. By the second leg 9, especially by a second free end of the second leg 9, the connection element 19 is coupled to the first receiving element 3, in particular it is hinged to it, in particular wherein the second leg 9 is hinged to the first receiving element 3. It can therefore be provided that the connection element 19 is arranged as a hinge connection between the first receiving element 3 and the second receiving element 4.

Moreover, the current meter 1 according to the invention is designed so that the handle 6 is mounted movable about a swivel axis, so that it can be recessed or pressed at least partly into a housing 13 transversely to the displacement direction 5 of the first receiving element 3. Thanks to the design according to the invention, it is possible to operate the current meter 1 with only one hand. Preferably, the handle 6, as represented in FIGS. 1 to 4, is arranged on one lengthwise side 20 of the current meter 1.

As represented in FIGS. 1 and 2, the current meter 1 according to the invention can have one or more holding elements 22. In the embodiment depicted, the two holding elements 22 are each arranged on one lengthwise side 20 of the current meter 1. It can be advantageous to configure the holding elements 22 as grip surfaces, especially rubberized grip surfaces.

The embodiment of the current meter 1 according to the invention which is represented in FIGS. 1 and 2 has several control elements 21 designed as activating elements for its operation, especially control elements 21 designed as push buttons. It is likewise conceivable that the control element 21 or the control elements 22 are fashioned as a touch screen, sensor switch, regulating knob or the like. Furthermore, the depicted embodiment of the current meter 1 according to the invention 1 has a regulator 14 for its operation, which can be designed, as shown here, as a regulating knob.

It can furthermore be advantageous for the current meter 1 according to the invention to have a display unit 23, for example, in order to indicate measurement results. It can be provided that the display unit 23 and the control element 22 are designed as a combined unit, especially as a touch screen which can be activated to operate the current meter 1 according to the invention.

The cutout represented in FIG. 5 relates to an enlarged and more detailed representation of the encircled region of the second receiving element 4 represented by the broken line in FIG. 4. As can be seen in this sectional representation, the second receiving element 4 can have a core 24, which can be made from a metal, in particular. On at least one side of the core 24, preferably the inner side facing the interior of the field receiver 2, at least one conductor element 25 can be arranged for the picking up of magnetic field lines and/or for induction of currents. Moreover, it can be provided that the at least one conductor element 25 is arranged radially about the core 25 and/or partly or entirely around the core. It can further be provided that the conductor element 25 is designed as a circuit board. In order to shield, or in particular insulate the core 24 and/or the conductor element 24, a sheathing 26 can be provided, in particular wherein the sheathing 26 is made from a nonconducting material. It can be provided that the first receiving element 3 is likewise constructed from a core 24, a conductor element 24 and/or a sheathing 26. It can be especially advantageous when the first receiving element 3 has no conductor element 24, but only a core 24 and/or a sheathing 26.

The current meter 1 according to the invention represented in FIGS. 1 to 4 is designed as a handheld device, especially a portable and/or one-hand-operation device.

LIST OF REFERENCE SYMBOLS

1 Current meter
2 Field receiver
3 First receiving element
4 Second receiving element
5 Displacement direction
6 Handle
7 Swivel element
8 First leg of the swivel element
9 Second leg of the swivel element
10 Angle
11 Guide element
12 Lengthwise axis of the current meter 1 according to the invention
13 Housing
14 Restoring element
15 Frame element
16 Regulator
17 End face of the first receiving element 3
18 End face of the second receiving element 4
19 Connection element
20 Lengthwise side of the current meter 1
21 Control element
22 Holder element
23 Display unit
24 Core
25 Conductor element
26 Sheathing

The invention claimed is:

1. A current meter (1) for the noncontact measuring of currents, comprising a magnetically conducting field receiver (2) having a first receiving element (3) and a second receiving element (4), the first receiving element (3) is movable in a displacement direction (5) relative to the second receiving element (4), and the field receiver (2) is movable from a closed measuring position to an open position in order to receive a cable by activating a handle (6), a movably mounted swivel element (7) having a first leg (8) and a second leg (9), wherein an angle (10) is subtended between the first leg (8) and the second leg (9), the first leg (8) is coupled to the handle (6) and the second leg (9) is coupled to the first receiving element (3), the handle and the first receiving element (3) are movable relative to each other, so that upon activating the handle (6) an activating force engaging with the first leg (8) is generated, and said activating force is converted by the swivel element (7) into a displacement force on the second leg (9), directed transversely to the activating force, so that the first receiving element (3) is moved by said displacement force such that the field receiver moves from the closed measuring position to the open position, a restoring element (14) provided as a pretensioned spring generating a restoring force is mounted so as to turn about an axis of rotation, and the restoring element (14) in the closed measuring position of the field receiver (2) presses the first receiving element (3) with impact against the second receiving element (4) via the second leg (9).

2. The current meter (1) as claimed in claim 1, wherein the displacement direction (5) is established by a guide element (11).

3. The current meter (1) as claimed in claim 1, wherein the field receiver (2) is closed into a ring in the closed measurement position.

4. The current meter (1) as claimed in claim 1, further comprising a housing (13), and the first receiving element (3) is pushed or pulled in a direction along a lengthwise axis (12) of the housing at least partly into a housing or the housing (13) in order to move the field receiver (2) into the open position.

5. The current meter (1) as claimed in claim 1, wherein the swivel element (7) includes a connection element (19), and the connection element (19) is coupled via the first leg (8) to the handle (6) by a hinged connection of the first leg (8) to the handle (6).

6. The current meter (1) as claimed in claim 1, wherein the current meter (1) is a handheld device.

7. The current meter as claimed in claim 1, further comprising a voltage meter.

8. The current meter as claimed in claim 1, wherein the displacement direction (5) runs along a lengthwise axis (12) of the current meter.

9. The current meter as claimed in claim 1, wherein the pretensioned spring turns about the axis of rotation together with a swivel element or the swivel element (7).

10. The current meter as claimed in claim 1, wherein an end face (17) of a free end of the first receiving element (3) is pressed against an end face (18) of a free end of the second receiving element (4).

11. The current meter as claimed in claim 1, wherein the second receiving element (4) is fashioned as a hook or is C-shaped.

12. The current meter (1) as claimed in claim 1, wherein the first receiving element (3) is movable by activating the handle (6) against a restoring force generated by the restoring element (14), and the second receiving element (4) is rigidly connected to a frame element (15) or a housing (13) of the current meter (1) or is formed stationary as part of the housing (1) or the frame element (15).

13. The current meter as claimed in claim 12, wherein the restoring element is arranged inside a housing (13) of the current meter (1).

14. The current meter as claimed in claim 12, wherein the restoring force is oriented counter to the displacement direction (5).

15. The current meter (1) is claimed in claim 1, wherein the handle (6) is mounted movable about a swivel axis, and is arranged on a lengthwise side (20) of the current meter (1).

16. The current meter as claimed in claim 15, wherein the handle is recessed or pressed at least partly into a housing (13), transversely to the displacement direction (5) of the first receiving element (3) so that the current meter (1) is operable with one hand.

17. The current meter as claimed in claim 1, wherein the current meter (1) is oriented so that the activating force is directed transversely to a lengthwise axis (12) of the current meter (1), and the handle (6) is movable transversely to the lengthwise axis (12) of the current meter (1).

18. The current meter as claimed in claim 17, wherein the handle is recessed or pressed into a housing (13).

19. A current meter (1) for the noncontact measuring of currents, comprising a magnetically conducting field receiver (2) having a first receiving element (3) and a second receiving element (4), the first receiving element (3) is movable in a displacement direction (5) relative to the second receiving element (4), and the field receiver (2) is movable from a closed measuring position to an open position in order to receive a cable by activating a handle (6), a movably mounted swivel element (7) having a first leg (8) and a second leg (9), wherein an angle (10) is subtended between the first leg (8) and the second leg (9), the first leg (8) is coupled to the handle (6) and the second leg (9) is coupled to the first receiving element (3), the handle and the first receiving element (3) are movable relative to each other, so that upon activating the handle (6) an activating force engaging with the first leg (8) is generated, and said activating force is converted by the swivel element (7) into a displacement force on the second leg (9), directed transversely to the activating force, so that the first receiving element (3) is moved by said displacement force such that the field receiver moves from the closed measuring position to the open position, a restoring element (14) provided as a pretensioned spring generating a restoring force is mounted so as to turn about an axis of rotation, and the first receiving element (3) is movable by activating the handle (6) against a restoring force generated by the restoring element (14), and the second receiving element (4) is rigidly connected to a frame element (15) or a housing (13) of the current meter (1) or is formed stationary as part of the housing (1) or the frame element (15).

\* \* \* \* \*